(12) United States Patent
Nagolu et al.

(10) Patent No.: US 10,899,357 B1
(45) Date of Patent: Jan. 26, 2021

(54) BI-DIRECTIONAL SNAP FIT ELECTRONIC UNIT

(71) Applicant: VEONEER US, INC., Southfield, MI (US)

(72) Inventors: Chakravarthi Mallikarjun Nagolu, Shelby Township, MI (US); Francis Joseph Judge, South Lyon, MI (US)

(73) Assignee: VEONEER US, INC., Southfield, MI (US)

( * ) Notice: Subject to any disclaimer, the term of this patent is extended or adjusted under 35 U.S.C. 154(b) by 0 days.

(21) Appl. No.: 16/563,768

(22) Filed: Sep. 6, 2019

(51) Int. Cl.
| | |
|---|---|
| *H04N 5/225* | (2006.01) |
| *B60W 40/08* | (2012.01) |
| *H05K 1/18* | (2006.01) |
| *G02B 5/20* | (2006.01) |
| *G02B 27/00* | (2006.01) |
| *H05K 1/02* | (2006.01) |
| *H05K 7/20* | (2006.01) |
| *H01R 12/53* | (2011.01) |
| *H01R 12/58* | (2011.01) |

(52) U.S. Cl.
CPC ............ *B60W 40/08* (2013.01); *G02B 5/208* (2013.01); *G02B 27/0093* (2013.01); *H04N 5/2256* (2013.01); *H05K 1/0203* (2013.01); *H05K 1/181* (2013.01); *H05K 7/2039* (2013.01); *B60W 2040/0818* (2013.01); *H01R 12/53* (2013.01); *H01R 12/58* (2013.01); *H05K 2201/066* (2013.01); *H05K 2201/10121* (2013.01); *H05K 2201/10303* (2013.01); *H05K 2201/10522* (2013.01)

(58) Field of Classification Search
CPC ............ G02B 27/0093; H04N 5/2256; H05K 1/0203; H05K 1/0212; H05K 1/181; H05K 7/2039; H05K 2201/066; H05K 2201/10303; B60W 2040/0818; B60W 2040/0827; H01R 12/53; H01R 12/58
See application file for complete search history.

(56) References Cited

U.S. PATENT DOCUMENTS

| | | | |
|---|---|---|---|
| 2019/0277703 A1* | 9/2019 | Valouch | H01L 31/02966 |
| 2020/0029002 A1* | 1/2020 | Polak | H04N 5/2251 |
| 2020/0062275 A1* | 2/2020 | Higgins | G06K 9/00845 |

* cited by examiner

*Primary Examiner* — Obafemi O Sosanya
(74) *Attorney, Agent, or Firm* — Dickinson Wright PLLC

(57) ABSTRACT

A device for emitting radiation includes a housing defining a cavity, an electrical connector formed on the housing, a heatsink having a flange, a circuit board located in the cavity having an emitter, and a filter located adjacent to the circuit board and opposite of the heatsink. The filter has at least one post that extends through a hole formed on the circuit board and through a hole formed on a flange of the heatsink. The at least one post has a press-fit termination end that engages the hole of the heatsink. The housing may be over-molded onto the heatsink.

20 Claims, 4 Drawing Sheets

BI-DIRECTIONAL SNAP FIT ELECTRONIC UNIT

BACKGROUND

1. Field of the Invention

The present invention generally relates to devices for emitting radiation, especially infrared radiation. The devices may be mounted to a module that may be mounted within an interior cabin of a vehicle.

2. Description of Related Art

Vehicles, especially automobiles, are undergoing significant developments involving autonomy. For example, some vehicles currently offered are able to perform some operations that were previously performed by the operator of the vehicle. For example, some vehicles include autonomous self-driving features, wherein the vehicle is able to pilot itself in certain situations.

However, while fully autonomous vehicles are currently under development, current vehicles generally rely on the operator of the vehicle to perform certain tasks in certain situations. For example, some vehicles with autonomous features are able to pilot themselves while operating in certain stretches of a highway at times when the weather is favorable. However, these vehicles may be unable to pilot themselves in other geographic areas or may be unable to pilot themselves in areas due to inclement weather. In these situations, the operator of the vehicle may be required to provide some operational input to the vehicle.

As such, because the operator the vehicle may be required to provide operational input into the vehicle, the operator of the vehicle should generally be aware of the environment in which the vehicle is operating in. To those ends, the driver should be positioned within the cockpit such that the driver can see the environment in which the vehicle is operating through the windows of the vehicle.

Systems have been developed that can generally monitor the eye movements of vehicle operators to determine if the operator is monitoring the environment in which the vehicle is operating in. These systems generally include a radiation source for emitting radiation towards an operator of a vehicle. This radiation is then reflected from the operator towards a camera system that can capture images of the operator and provide these images to a vehicle system that determines if the operator is properly monitoring the environment in which the vehicle is operating in.

SUMMARY

A device for emitting radiation includes a housing defining a cavity, an electrical connector formed on the housing, a heatsink having a flange, a circuit board having an emitter and located in the cavity of the housing and adjacent to an engaging portion of the heatsink, and a filter located adjacent to the circuit board and opposite of the heatsink. The filter has at least one post that extends through a hole formed on the circuit board and through a hole formed on a flange of the heatsink. The at least one post has a press fit termination end that engages the hole of the heatsink. The housing may be over-molded onto the heatsink.

Further objects, features, and advantages of this invention will become readily apparent to persons skilled in the art after a review of the following description, with reference to the drawings and claims that are appended to and form a part of this specification.

DETAILED DESCRIPTION

Figure 1:
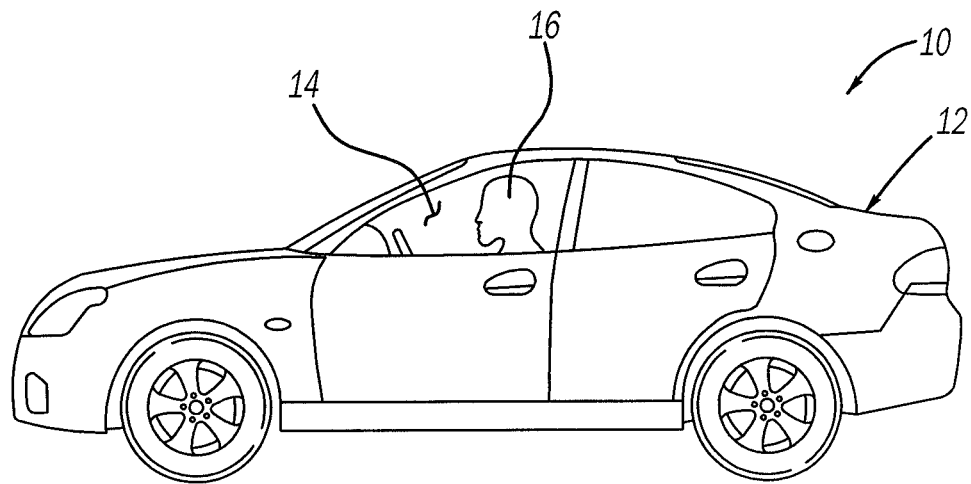
FIG. 1 illustrates a vehicle incorporating the device for emitting radiation.

Referring to FIG. 1, one example 10 incorporating a module having a device for emitting radiation is shown. In the example 10, the module for emitting radiation is incorporated within a vehicle 12. It should be understood that the module for emitting radiation that will be described in more detail later in this specification can be incorporated into any one of a number of different environments. Here, the module is incorporated within a vehicle and more specifically within an automobile.

If the module is incorporated within a vehicle, such as the vehicle 12, it should be understood that the vehicle 12 may be any one of a number of different vehicles capable of transporting persons or goods between two separate locations. As such, the vehicle could be an automobile, as stated before, or the vehicle could be a truck, heavy-duty truck, tractor-trailer, mining vehicle, locomotive, aircraft, watercraft, and the like. Again, the vehicle 12 can take any one of a number of different forms.

Figure 2:
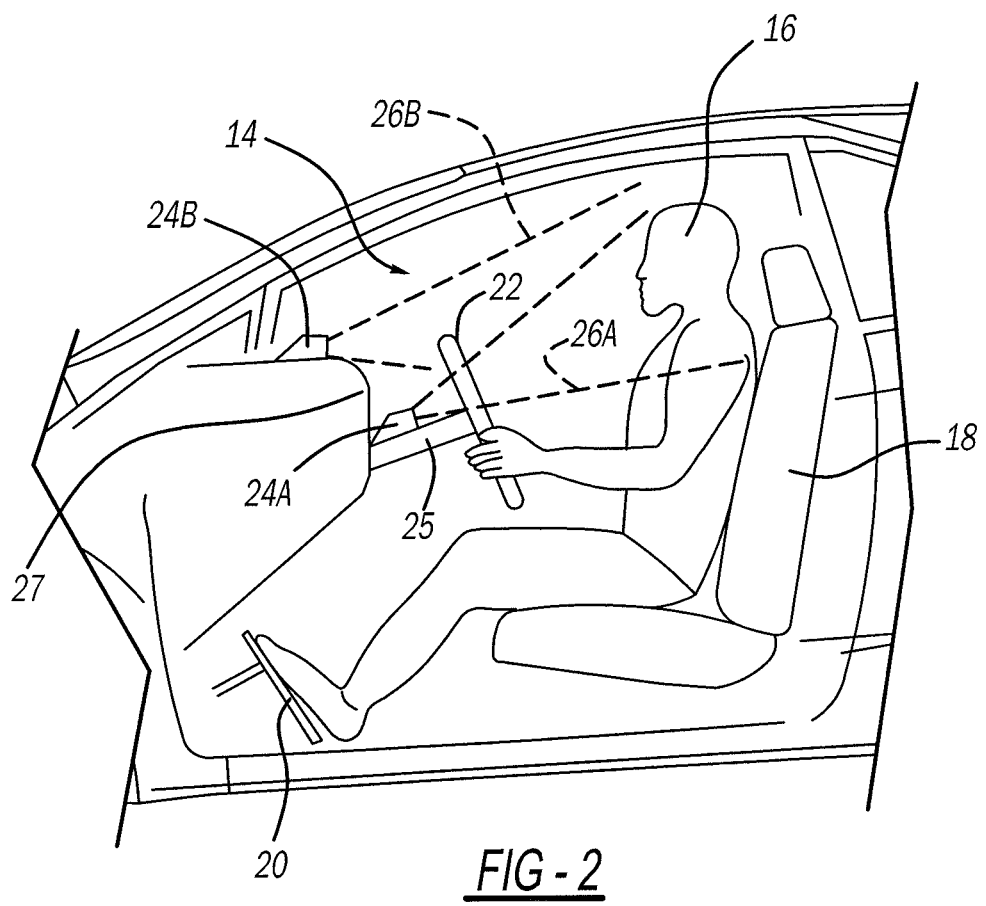
FIG. 2 illustrates a more detailed view of a side view of the interior of the vehicle of FIG. 1.

Here, the vehicle 12 generally defines an interior 14 that is configured to receive an operator 16 that operates the vehicle 12 from within the interior of the vehicle 12. As best shown in FIG. 2, the interior 14 of the vehicle 12 may include a seat 18 that is capable of supporting the operator 16 within the interior 14 of the vehicle 12.

The operator 16 is capable of engaging any one of a number of different vehicle systems to pilot the vehicle 12 between separate locations. For example, the operator 16 may engage a steering wheel 22 that controls a steering system to control the steering of the vehicle 12. Additionally, the operator 16 may also be able to engage one or more pedals 20 to control the forward or rearward movement of the vehicle 12. The one or more pedals 20 may be in communication with a vehicle powertrain and or braking system to propel the vehicle 12 either forward or rearward and/or stop the vehicle 12 when desired by the operator 16.

Located within the interior 14 of the vehicle 12 are one or more modules 24A and/or 24B for emitting radiation. It should be understood that any one of a number of different modules 24A and/or 24B may be utilized and placed within the interior 14 of the vehicle 12. Here, in this example, two such modules 24A and 24B are shown. The module 24A is generally located above a steering column 25 that is attached to the steering wheel 22. The module 24A is placed above steering column 25 to have a field of view 26A. This field of view 26A may be such that the field of view 26A includes portions of the operator 16 and possibly portions of other occupants located within the interior 14 of the vehicle 12.

Figure 3:
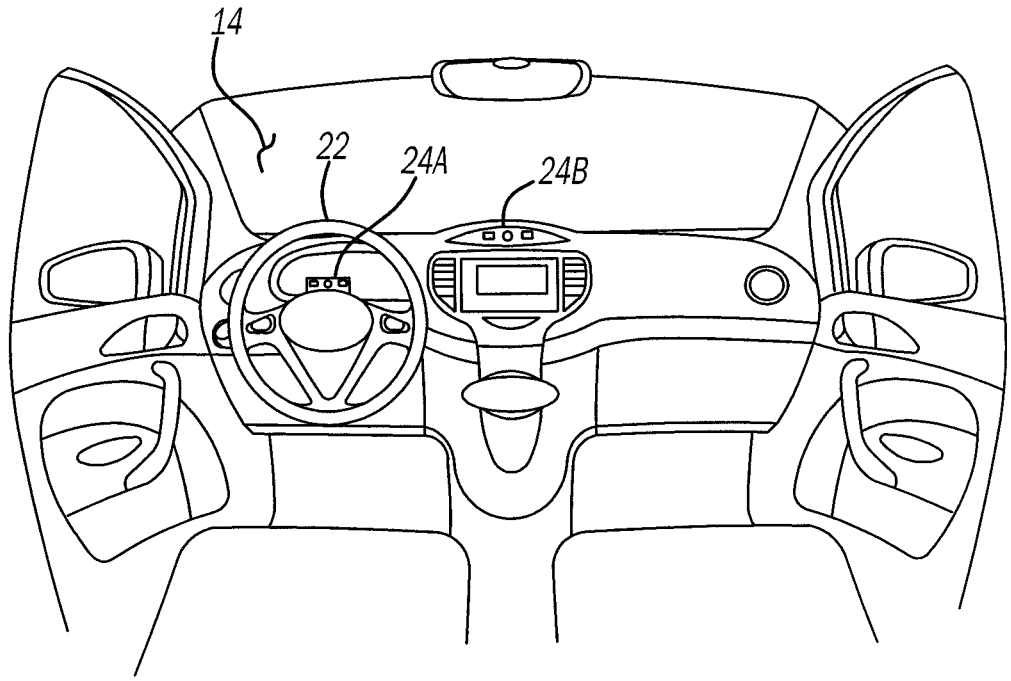
FIG. 3 illustrates a more detailed view of a front view of the interior of the vehicle of FIG. 1.

The module 24B is located generally above a center stack 27 of the vehicle 12. As it is well understood, the center stack 27 is located generally in the middle of the front interior of the vehicle 12, as best shown in FIG. 3. The center stack 27 may include a number of different vehicle systems, such as vehicle infotainment system and heating, ventilation, and cooling systems and/or other controls for the vehicle 12.

The module 24B is situated to have a field of view 26B. The field of view 26B may include all or parts or even none of the field of view 26A provided by the other module 24A. As such, the module 24B may be utilized to view more broadly multiple occupants, including the operator 16, located within the interior 14 of the vehicle 12. Conversely, the module 24A may be utilized to focus on portions of the operator 16, such as the face of the operator 16 more particularly. Furthermore, it should be understood that the fields of view 26A and 26B may be shaped or formed by the device, as will be indicated later in this specification. For example, the fields of view 26A and 26B may be views or angles in which radiation is emitted from the devices. These angles of radiation may be conical in nature, essentially equal from all sides, or may be shaped differently so as to expand and retract the angle radiation in either the X and/or Y direction, for example, in either direction perpendicular to the direction of emission.

One possible reason for carefully focusing on portions of the operator 16 by the module 24A is so that the module 24A is capable of capturing images of the face and facial features of the operator 16. This may be desirable in situations where control systems within the vehicle 12 are determining if the operator 16 is properly engaging the vehicle 12 and/or is properly focused on the environment in which the vehicle 12 is operating. If the control systems determine that the operator 16 is not properly engaging the vehicle 12 and or is not properly focused on the environment, the control systems may alert the operator 16 of this failure through either an audible, visual, and/or tactile feedback.

For example, if the vehicle 12 is an autonomous vehicle or semi-autonomous vehicle, there may be situations where the autonomous features of the vehicle are unable to operate the vehicle in the environment in which it is situated. This may arise in situations wherein there is inclement weather or where there is a scenario that is unfamiliar to the autonomous features of the vehicle. These unfamiliar scenarios can include situations that involve road construction, accidents, and other types of scenarios in which the autonomous vehicle may not be suitable for autonomously operating the vehicle 12 without operator assistance.

Therefore, by having the vehicle 12 utilize the modules 24A and/or 24B, vehicle systems and subsystems of the vehicle 12 can determine if the operator 16 is properly engaging the vehicle 12 and/or aware of the environment in which the vehicle 12 is operating. If the operator 16 is not properly engaging the vehicle 12 or is not aware of the environment in which the vehicle 12 is operating, one or more vehicle systems could alert the operator 16 either through a tactile, audible, and/or visual feedback so as to alert the operator 16 that they should properly engage the vehicle 12 or pay closer attention to the environment in which the vehicle 12 is operating and prepare to engage the controls of the vehicle 12.

Figure 4:
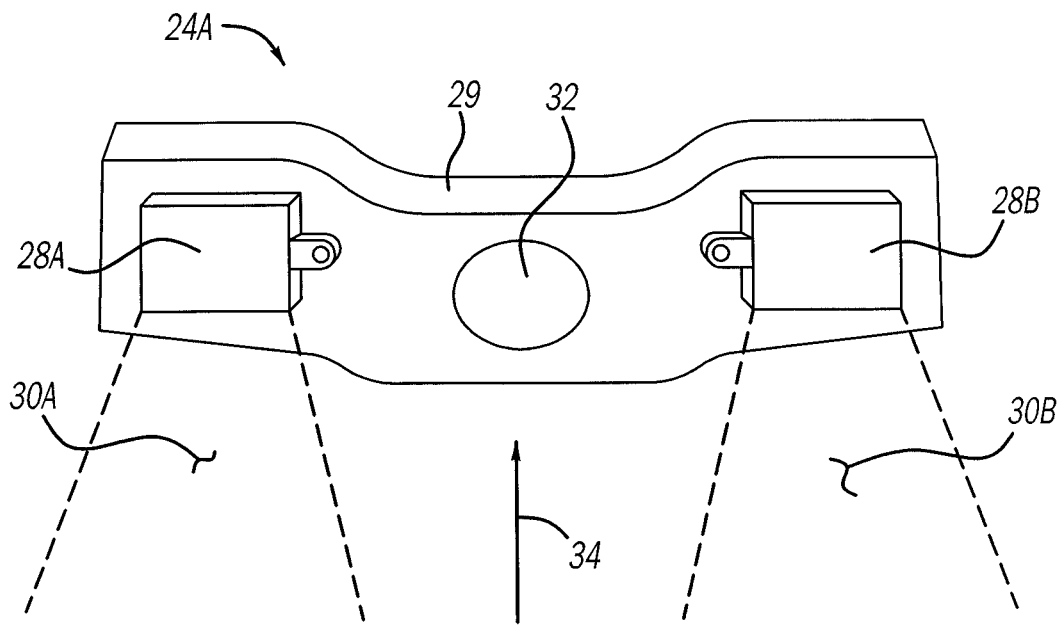
FIG. 4 illustrates a module incorporating two devices for emitting radiation.

Referring to FIG. 4, a more detailed view of the module 24A is shown. It should be understood that the description provided for the module 24A may be equally applicable to the module 24B. Here, the module 24A includes a bracket 29 that may be configured to be mounted within the interior 14. Moreover, the bracket 29 may be mounted on the steering wheel 22, the steering column 25, and/or the center stack 27 of the vehicle 12. Of course, it should be understood that the bracket 29 may be mounted anywhere within the interior 14 of the vehicle 12.

The bracket 29 may be made of any one of a number of different materials. As such, the bracket 29 may be made of steel, aluminum, plastic, or any material capable of forming a solid or semi-solid shape. In this example, the bracket 29 may be made of a heat conductive material, such as steel or aluminum so that the bracket 29 may act as a heatsink.

The bracket 29 functions to hold one or more devices 28A and/or 28B that are configured to emit radiation from the devices into the interior 14 of the vehicle 12. Here, the devices 28A and 28B emit radiation over fields of view 30A and 30B, respectively. The fields of view 30A and 30B may essentially be an angle of radiation. The angle of radiation is the angle in which the radiation is emitted from the device 28A and/or 28B. As will be explained later in this specification, the angle of radiation may be a single angle of radiation or may be multiple angles of radiation to form the projection of the radiation from the device 28A and/or 28B.

This radiation may be any one of a number of different forms of radiation. As such, this radiation may be infrared radiation or may be radiation within the visible spectrum. Again, it should be understood that the radiation can be any one of a number of different forms of radiation, not necessarily infrared radiation or radiation within the visible spectrum.

Located between the devices 28A and 28B may be a camera 32 that is capable of receiving reflected radiation as indicated by arrow 34. The reflected radiation 34 may be radiation that was reflected by one or more objects. This radiation may have originated from the devices 28A and/or 28B and then was reflected by an object within the field of view (angle of radiation) of the devices 28A and/or 28B. The camera 32 may be connected to any one of a number of different vehicle systems that can interpret this radiation that was captured by the camera 32. The radiation captured by the camera 32 may be in the form of a plurality of images captured by the camera 32 over a period of time.

Figure 5A:
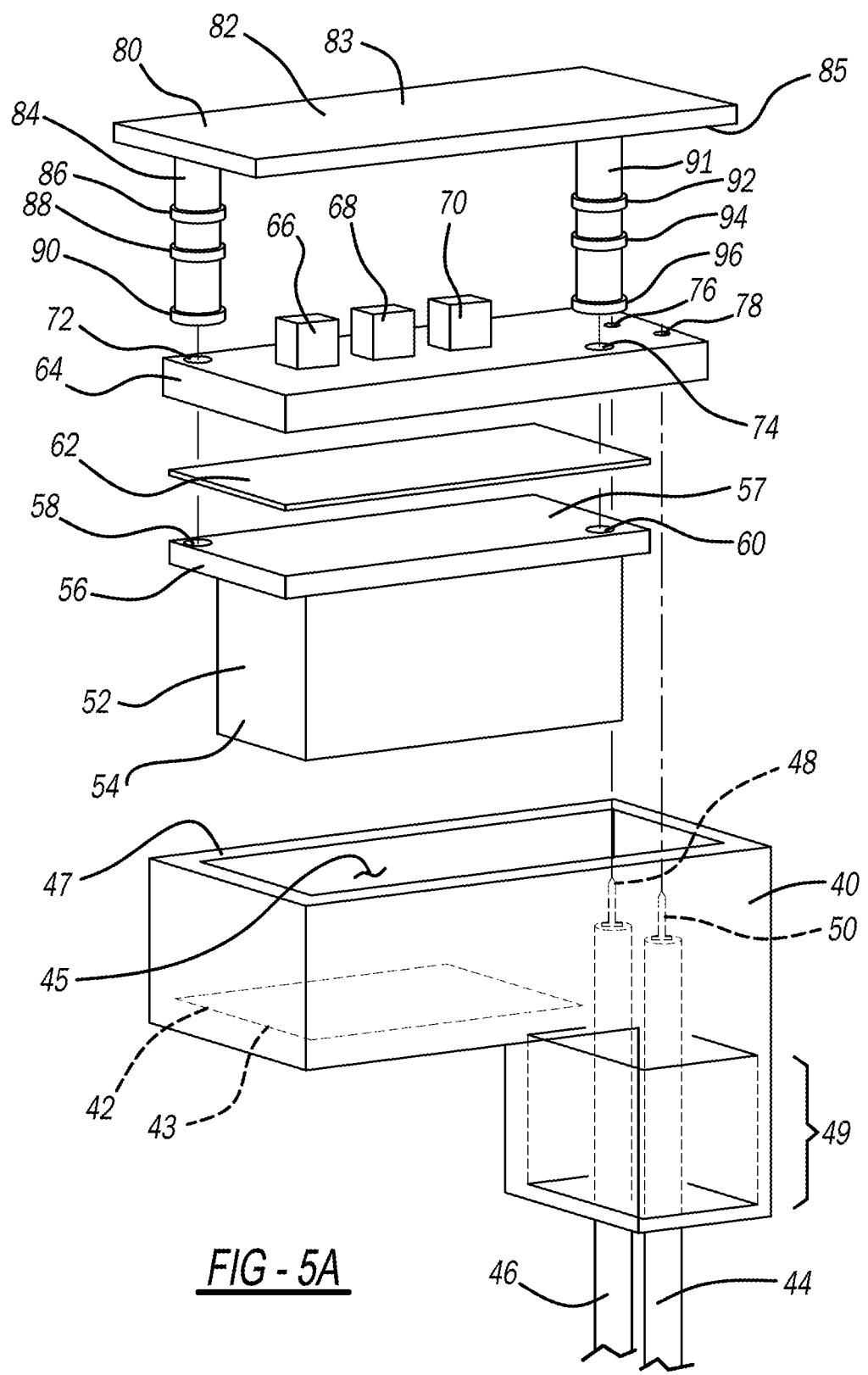
FIG. 5A illustrates an exploded view of the device for emitting radiation.
Figure 5B:
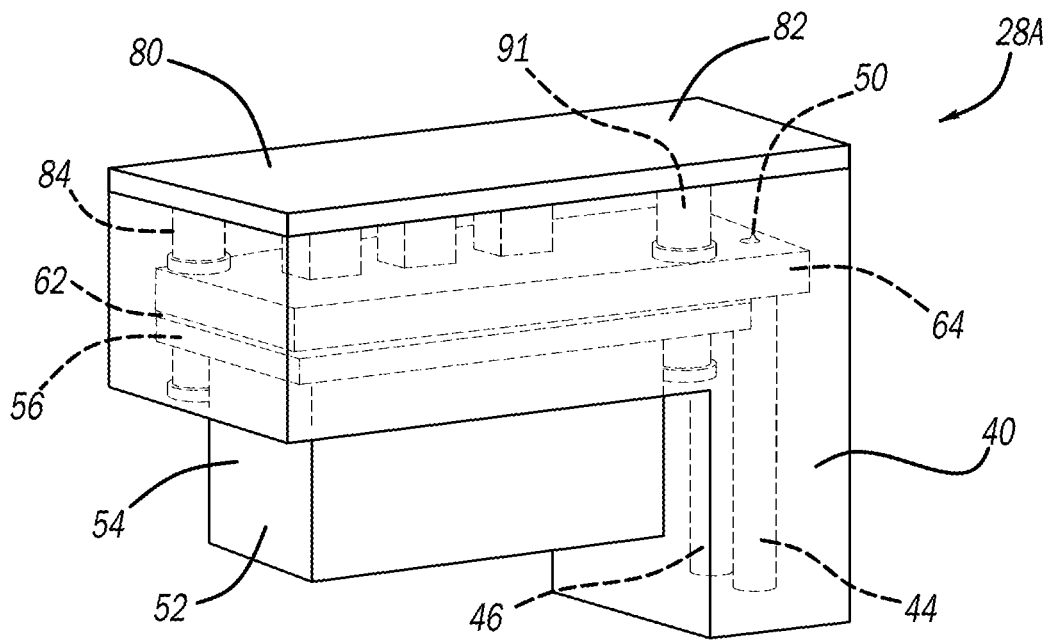
FIGS. 5B and 5C illustrate views of the assembled device for emitting radiation.
Figure 5C:
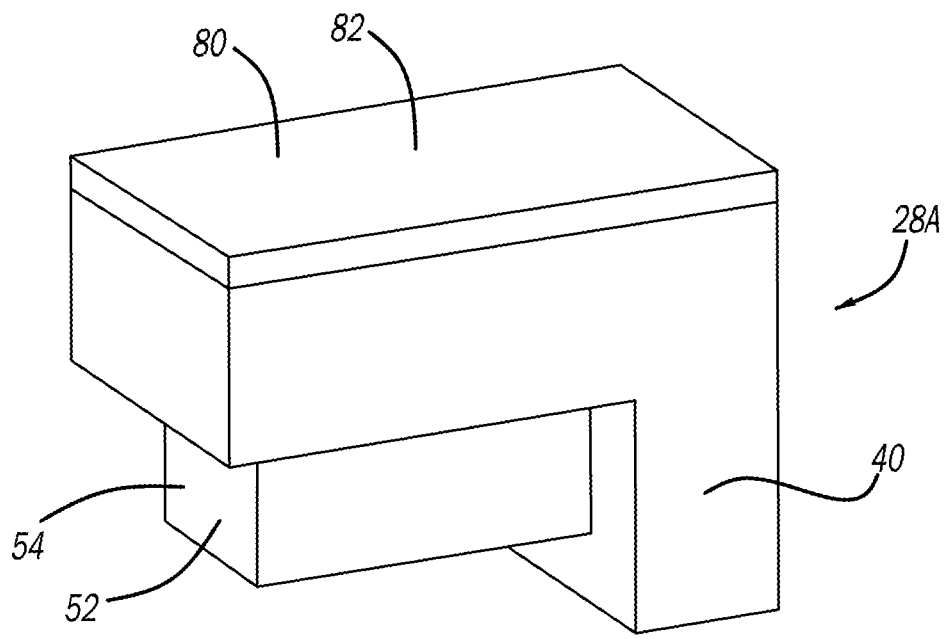

Referring to FIGS. 5A, 5B, and 5C, more detailed illustrations of the device 28A are shown. It should be understood that any description regarding the device 28A is equally applicable to the device 28B mentioned in the paragraphs above and in the previously referenced figures. Moreover, FIG. 5A illustrates an exploded view of the device 28A. FIG. 5B illustrates an assembled view of the device 28A with the internal components shown. Finally, as to FIG. 5C, this figure illustrates an assembled view of the device 28A, without showing the internal components.

As best shown in FIG. 5A, the device 28A includes a housing 40, a heatsink 52, a circuit board 64, and a filter 80. The device 28A may also include a thermally conductive layer 62 disposed between a engaging portion 57 of the heatsink 52 and the circuit board 64. The purpose of the thermally conductive layer 62 is to enhance the thermal communication between the circuit board 64 and the heatsink 52 to more effectively dissipate heat generated by the circuit board 64 by the heatsink 52.

The housing 40 generally defines a cavity 45 and an opening 47 that is substantially covered by the filter 80 when assembled. The housing 40 may have a side that is generally facing in the direction of emission of the emitters, which is depicted toward the top of the page in FIG. 5A-C. The housing 40 may have an electrical connector 49 extending from the housing 40, opposite of the filter 80. Extending through the electrical connector 49 may be one or more wires 44 and 46. The wires 44 and/or 46 may be connected to other vehicle systems that allow for the control of the device 28A by another vehicle system.

Also located within the housing 40 are press-fit pins 48 and 50 that extend into the cavity 45 from the connector 49. The press-fit pins 48 and 50 are electrically connected to the wires 46 and 44, respectively. The press-fit pins 48 and/or 50 allow for a press fit type connection. A press-fit connection is formed when the press-fit pins 48 and/or 50 are pressed into a fitted, plated-through hole in a printed circuit board. Here, the press-fit pins 48 and/or 50 are pressed into through holes 76 and 78 of the circuit board 64, respectively, essentially attaching the press-fit pins 48 and 50 to the circuit board 64.

The heatsink 52 includes a engaging portion 57 that forms a flange 56. A heat transfer portion 54 of the heatsink 52 has an overall footprint smaller than that of the flange 56. The housing 40 includes an opening 42 that is configured to receive the heat transfer portion 54 of the heatsink 52. The opening 42 of the housing 40 is of such a size that the heat transfer portion 54 of the heatsink 52 can pass through the opening 42, but the flange 56 cannot. As such, when the heat transfer portion 54 of the heatsink 52 extends through the opening 42, portions 43 of the housing 40 defining the opening 42 engage the flange 56, preventing further travel of the heatsink 52 through the opening 42. The housing 40 may be over-molded onto the heatsink 52, thereby holding the heatsink 52 in place.

The heatsink 52 may also include through holes 58 and 60 located at opposing corners of the flange 56 of the heatsink 52. Of course, it should be understood that the heatsink 52 may include any one of a number of through holes located at different locations on the heatsink 52 and not necessarily restricted to just the flange 56.

The circuit board 64 may be a printed circuit board commonly utilized in electronics. The circuit board 64 may be a rigid circuit board or could be a flexible circuit board. As stated previously, the circuit board 64 has plated through holes 76 and 78 that both physically and electrically interact with press-fit pins 48 and 50, respectively. The circuit board 64 may have any one of a number of different components mounted thereon. In this example, the printed circuit board 64 has one or more emitters, shown as emitters 66, 68, and 70, that are configured to emit radiation. In this example, the emitters 66, 68, and/or 70 are configured to emit infrared radiation. However, it should be understood that the emitters 66, 68, and/or 70 may emit any type of radiation.

The control of the emission of radiation by the emitters 66, 68, and/or 70 is provided by electrical signals from the wires 44 and/or 46 which then are provided to the press-fit pins 48 and/or 50. From there, the press-fit pins 48 and/or 50 provide the electrical signal to the plated through holes 76 and 78 which, in turn, are in electrical communication with the emitters 66, 68, and/or 70 via conductive traces in the circuit board 64. As such, signals provided to the wires 44 and/or 46 can, therefore, control the emitters 66, 68, and/or 70.

The circuit board 64 has through holes 72 and 74 generally located at opposing corners of the circuit board 64. The through holes 72 and 74 may be in line with the through holes 58 and 60 of the heatsink 52, respectively, when the device 28A is assembled.

The filter 80 includes a flat portion 82 having an outer surface 83 and a inner surface 85. The flat portion 82 of the filter 80 may be substantially rectangular in shape as shown.

The filter 80 is configured to filter some portions of the radiation emitted by the emitters 66, 68, and/or 70. Here, the filter 80 may be a long pass filter configured to filter out visible light generated by the emitters 66, 68, and/or 70, but allow for the transmission of infrared light. The purpose of this filtering is so that a person within the interior of the vehicle is not distracted by any visible light incidentally emitted by the device 28A, but still allow for the transmission through the filter 80 of infrared radiation, which is invisible to the naked eye, that may be used to illuminate the cabin of the vehicle.

Extending from the inner side 85 of the filter 80 are posts 84 and 91. The posts 84 and 91 may be located at and extend from opposing corners of the inner side 85 of the filter 80. The post 84 is substantially in-line with through hole 72 of the circuit board and the through hole 58 of the heatsink 52. Similarly, the post 91 is substantially in-line with the through hole 74 of the circuit board and the through hole 60 of the heatsink 52. The posts 84 and/or 91 may be one single unitary piece along with the flat portion 82 of the filter 80. As such, the flat portion 82 and the posts 84 and 91 may be made of a single piece of material.

The posts 84 and 91 both include three protrusions that radiate outward from the circumferential diameter of the posts 84 and 91. More specifically, post 84 includes protrusions 86, 88, and 90. Post 91 includes protrusions 92, 94, and 96. The posts 84 and 91 are made of a material that allows for some flexing. The post 84 is configured to be inserted through the through hole 72 of the circuit board 64 and the through hole 58 of the heatsink 52. When inserted through the through holes 72 and 58, the protrusions 86 and 88 essentially sandwich the circuit board 64 and the flange 56 of the heatsink 52 between them via a snap-fit. The lower protrusion 90 extends to and rests on top of the portion 43 of the housing 40 defining the opening 42.

The same is true for post 91. Moreover, when the post 91 is extended through the through hole 74 of the circuit board 64 and the through hole 60 of the heatsink 52, the protrusions 92 and 94 essentially sandwich the circuit board 64 and the flange 56 between them via a snap fit. The lower protrusion 96 then rests on a portion 43 of the housing 40 that the fines the opening 42.

As such, when assembled, the press-fit pins 48 and 50 function to mechanically engage the through holes 76 and 78 essentially attaching the circuit board 64 thereto. In addition, because the heatsink 52 is over-molded onto the housing 40, the posts 84 and 91, when inserted through the through holes 72, 58, 74, and 60 essentially attached the filter 80 and the circuit board 64 to the heatsink 52, which, as stated previously, is over-molded onto the housing 40. In some implementations, the heatsink 52 may be over-molded onto the housing 40 before the press-fit pins 48 and 50 and/or the posts 84 and 91 are inserted through holes in the circuit board. In some implementations, the heatsink 52 may be over-molded onto the housing 40 after the press-fit pins 48 and 50 and/or the posts 84 and 91 are inserted through holes in the circuit board. Therefore, the assembled device 28A can withstand the rigors and environmental conditions in which vehicles are subject to without the use of additional fastening.

As a person skilled in the art will readily appreciate, the above description is meant as an illustration of an implementation of the principles of this invention. This description is not intended to limit the scope or application of this invention in that the invention is susceptible to modification, variation, and change, without departing from the spirit of this invention, as defined in the following claims.

The invention claimed is:

1. A device for emitting radiation, the device comprising:
a housing defining a cavity, the housing having an emitter side and a heatsink side;
an electrical connector formed on the heatsink side of the housing, the electrical connector having at least one press-fit pin extending into the cavity of the housing;
a heatsink having an engaging portion and a heat transfer portion, the engaging portion of the heatsink having a flange, the flange having a through hole;
a circuit board located in the cavity of the housing and adjacent to the engaging portion of the heatsink, the circuit board having at least one emitter for emitting radiation through an emitter opening formed in the emitter side of the housing;
the circuit board having a first through hole and a second through hole, wherein the at least one press-fit pin engages the first through hole of the circuit board and providing electrical connection to the circuit board;
a filter located adjacent to the circuit board on the emitter side and opposite of the heatsink, the filter being configured to filter radiation passing through the emitter opening from the at least one emitter;
the filter having at least one post, the at least one posts extends through the second through hole of the circuit board and through hole of the flange of the heatsink and holding the circuit board and heatsink to the filter; and
the at least one post having a press fit termination end that engages the through hole of the heatsink.

2. The device for emitting radiation of claim 1, further comprising a thermally conductive layer disposed between the engaging portion of the heatsink and the circuit board.

3. The device for emitting radiation of claim 1, wherein the post further comprises a protrusion located along the length of the post, the protrusion configured to engage an emitter side of the circuit board, the emitter side of the circuit board being adjacent to the filter and opposite of the heatsink.

4. The device for emitting radiation of claim 1, wherein the heatsink side of the housing further comprises heatsink opening having a perimeter, wherein the heat transfer portion of the heatsink extends through the heatsink opening of the housing and the flange of the heatsink engages the perimeter of the housing that defines the heatsink opening.

5. The device for emitting radiation of claim 4, wherein the housing is over-molded onto the heatsink.

6. The device for emitting radiation of claim 1, wherein the filter is a long pass filter.

7. The device for emitting radiation of claim 1, wherein the filter has a flat portion having an outer surface and an inner surface, wherein the post extends from the inner surface of the filter, and the flat portion of the filter substantially covers the cavity of the housing.

8. The device for emitting radiation of claim 7, wherein the flat portion of the filter is substantially rectangular in shape.

9. The device for emitting radiation of claim 8, wherein the at least one post is two posts.

10. The device for emitting radiation of claim 9, wherein one of the two posts is located near a first corner of the flat portion of the filter, while the other post is located near a second corner of the flat portion of the filter.

11. The device for emitting radiation of claim 10, wherein the first corner and second corner of the filter are located at opposing ends of the flat portion of the filter.

12. The device for emitting radiation of claim 7, wherein the flat portion of the filter and the at least one post of the filter are a single unitary piece.

13. The device for emitting radiation of claim 1, wherein the at least one emitter is an infrared emitter.

14. A module comprising:
a camera;
at least one device for emitting radiation, the at least one device comprising:
a housing defining a cavity, the housing having an emitter side and a heatsink side;
an electrical connector formed on the heatsink side of the housing, the electrical connector having at least one press-fit pin extending into the cavity of the housing;
a heatsink having an engaging portion and a heat transfer portion, the engaging portion of the heatsink having a flange, the flange having a through hole;
a circuit board located in the cavity of the housing and adjacent to the engaging portion of the heatsink, the circuit board having at least one emitter for emitting radiation through an emitter opening formed in the emitter side of the housing;
the circuit board having a first through hole and a second through hole, wherein the at least one press-fit pin engages the first through hole of the circuit board and providing electrical connection to the circuit board;
a filter located adjacent to the circuit board on the emitter side and opposite of the heatsink, the filter being configured to filter radiation passing through the emitter opening from the at least one emitter;
the filter having at least one post, the at least one posts extends through the second through hole of the circuit board and through hole of the flange of the heatsink and holding the circuit board and heatsink to the filter; and
the at least one post having a press fit termination end that engages the through hole of the heatsink.

15. The module of claim 14, wherein the at least one device comprises two devices for emitting radiation.

16. The module of claim 15, wherein the camera is disposed within the module between the two devices for emitting radiation.

17. A vehicle having an interior, the vehicle comprising:
a camera;
at least one device for emitting radiation, the at least one device comprising:
a housing defining a cavity, the housing having an emitter side and a heatsink side;
an electrical connector formed on the heatsink side of the housing, the electrical connector having at least one press-fit pin extending into the cavity of the housing;
a heatsink having an engaging portion and a heat transfer portion, the engaging portion of the heatsink having a flange, the flange having a through hole;
a circuit board located in the cavity of the housing and adjacent to the engaging portion of the heatsink, the circuit board having at least one emitter for emitting radiation through an emitter opening formed in the emitter side of the housing;
the circuit board having a first through hole and a second through hole, wherein the at least one press-fit pin engages the first through hole of the circuit board and providing electrical connection to the circuit board;

a filter located adjacent to the circuit board on the emitter side and opposite of the heatsink, the filter being configured to filter radiation passing through the emitter opening from the at least one emitter;

the filter having at least one post, the at least one posts extends through the second through hole of the circuit board and through hole of the flange of the heatsink and holding the circuit board and heatsink to the filter; and the at least one post having a press fit termination end that engages the through hole of the heatsink.

18. The vehicle of claim 17, wherein the module is orientated within the vehicle such that a field of view of the camera includes an occupant located within the interior of the vehicle.

19. The module of claim 18, wherein the at least one device comprises two devices for emitting radiation, the two devices are mounted within a module having the camera.

20. The module of claim 19, wherein the camera is disposed between the two devices for emitting radiation.

* * * * *